United States Patent
Park

(10) Patent No.: US 6,963,502 B2
(45) Date of Patent: Nov. 8, 2005

(54) APPARATUS FOR DIVIDING BANK IN FLASH MEMORY

(75) Inventor: Jin Su Park, Daekukwangyeok-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 128 days.

(21) Appl. No.: 10/736,855

(22) Filed: Dec. 16, 2003

(65) Prior Publication Data
US 2004/0174727 A1 Sep. 9, 2004

(30) Foreign Application Priority Data
Mar. 5, 2003 (KR) .................... 10-2003-0013645

(51) Int. Cl.[7] .............................................. G11C 16/00
(52) U.S. Cl. .............. 365/185.11; 365/63; 365/185.33; 365/230.03
(58) Field of Search ................... 365/185.11, 185.33, 365/230.03, 63, 72

(56) References Cited

U.S. PATENT DOCUMENTS 4,658,377 A * 4/1987 McElroy ..................... 365/149
5,216,633 A * 6/1993 Weon et al. ............ 365/189.07

* cited by examiner

Primary Examiner—Tan T. Nguyen
(74) Attorney, Agent, or Firm—Marshall, Gerstein & Borun LLP

(57) ABSTRACT

The present invention relates to an apparatus for dividing a bank in a flash memory. A block of the flash memory is divided into two banks and each page buffer is located between the two banks to share an input/output line. Therefore, it is possible to shorten the length of a bit line, improve a data sensing rate, and allow one bank to perform one operation while the other bank performs a read, write or erase operation.

4 Claims, 4 Drawing Sheets

APPARATUS FOR DIVIDING BANK IN FLASH MEMORY

BACKGROUND

1. Field of the Invention

The present invention relates to an apparatus for dividing a bank in a flash memory and, more particularly, to an apparatus for dividing a bank in a NAND flash.

2. Discussion of Related Art

A conventional NAND flash memory can be implemented with a very small cell area and is thus suitable for high-integrated memory devices. This type of the flash memory, however, requires long time to read a first data and also needs long time for programming. Furthermore, the conventional flash memory has a disadvantage that it could not perform one operation while the other operation is performed.

FIG. 1 is a conceptual view illustrating the structure of a bank in a conventional NAND flash memory.

Referring to FIG. 1, a page buffer 20 and a cache buffer 30 are intervened between a NAND flash memory bank 10 and an input/output line 40. Data inputted via the cache buffer 30 are sent to the page buffer 20. Data for performing a next page program, while a selected page is being programmed, is transferred to the cache buffer 30. It is thus possible to improve the speed of the read operation and the program operation in a conventional single bank structure. By using the cache buffer 30, the data input operation can be simultaneously performed while the program operation is being performed and a next page can be read out to the page buffer 20 while the data is being outputted. In this case, however, there still remains a problem that other operations could not be performed while the read, program or erase operation is performed.

SUMMARY OF THE INVENTION

The present invention is contrived to solve the aforementioned problems. The present invention is directed to provide an apparatus for dividing a bank in a flash memory in which a block of the flash memory is divided into two banks and respective page buffers are located between the two banks to share an input/output line, thus shortening the length of a bit line, improving a data sensing speed, and allowing one bank to perform one operation while the other bank performs a read, write or erase operation.

According to the present invention, there is provided an apparatus for dividing a bank in a flash memory, the flash memory having a first bank and a second bank that share an input/output line, comprising; a first page buffer connected to a bit line of the first bank, and buffering a data that will be transmitted to/from the first bank; a second page buffer connected to a bit line of the second bank, and buffering a data that will be transmitted to/from the second bank; a first page buffer select mean connected between the first page buffer and a first node, and controlling a transmission of the data that will be transmitted to/from the first page buffer; a second page buffer select mean connected between the second page buffer and the first node, and controlling transmission of the data that will be transmitted to/from the second page buffer; and a switching mean connected between the first node and the input/output line, and controlling transmission of the data between the first and second page buffer select means and the input/output line.

In the aforementioned of an apparatus for dividing a bank in a flash memory according to another embodiment of the present invention, the first page buffer select mean comprises a first transistor connected between the first page buffer and the first node, and driven by an external first control signal.

In the aforementioned of an apparatus for dividing a bank in a flash memory according to another embodiment of the present invention, the second page buffer select mean comprises a second transistor connected between the second page buffer and a second node, and driven by an external second control signal.

In the aforementioned of an apparatus for dividing a bank in a flash memory according to another embodiment of the present invention, the switching mean comprises a third transistor connected between the first node and the input/output line, and driven by an external third control signal.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF PREFERRED EMBODIMENTS

Figure 1:
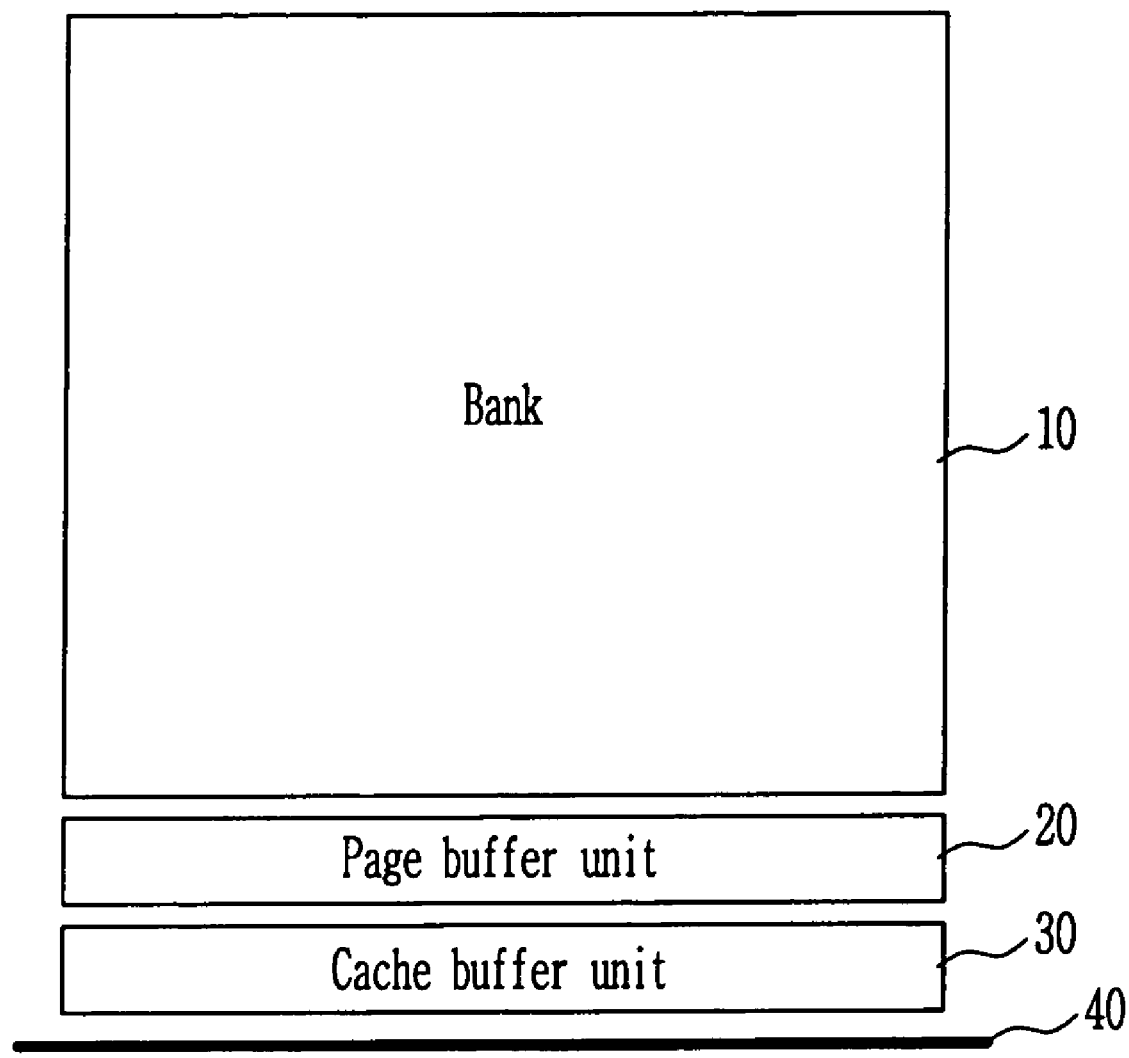
FIG. 1 is a conceptual view illustrating the structure of a bank in a conventional NAND flash memory.

The present invention will now be described in detail in connection with preferred embodiments with reference to the accompanying drawings, in which like reference numerals are used to identify the same or similar parts.

Figure 2:
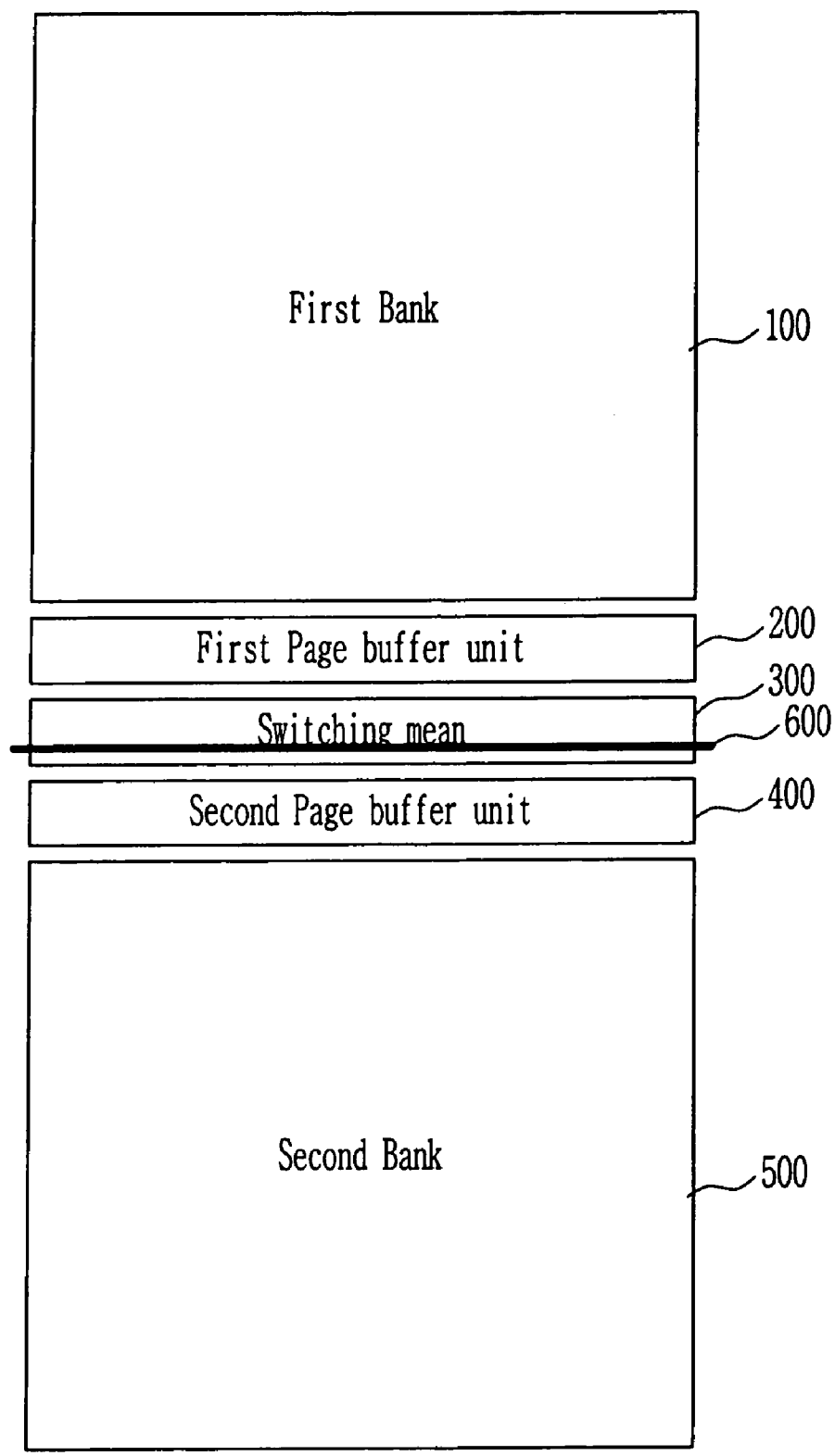
FIG. 2 is a conceptual view illustrating the structure of a bank in a NAND flash memory according to a preferred embodiment of the present invention.

FIG. 2 is a conceptual view illustrating the structure of a bank in a NAND flash memory according to a preferred embodiment of the present invention.

Referring to FIG. 2, proposed chip architecture has an entire memory cell array divided into a first bank 100 and a second bank 500. The first bank 100 and the second bank 500 include a first page buffer unit 200 for paging the first bank 100 and a second page buffer unit 400 for paging the second bank 500, respectively. The first page buffer unit 200 and the second page buffer unit 400 share the same input/output line 600 through a switching mean 300.

The first page buffer unit 200 and the second page buffer unit 400 can exchange data each other, which allows a counterpart to be used as a cache buffer. It is thus possible for one bank to perform one operation while the other bank performs a read, write or erase operation as well as the existing cache buffer operation.

Figure 3:
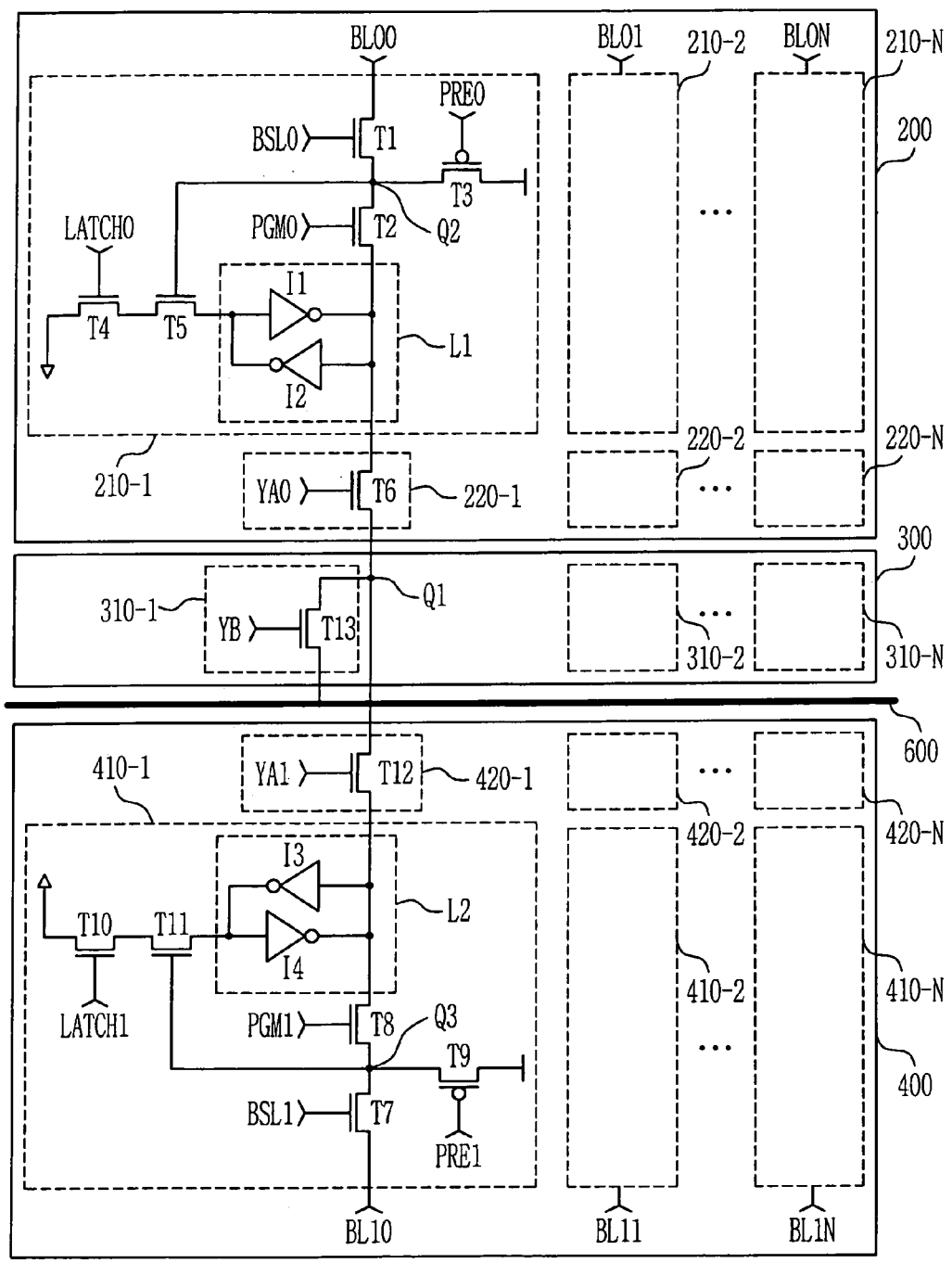
FIG. 3 is a circuit diagram illustrating a page buffer unit and a switching mean according to a preferred embodiment of the present invention.

FIG. 3 is a circuit diagram illustrating the page buffer unit and the switching mean according to a preferred embodiment of the present invention.

With reference to FIG. 3, the first and second page buffer units 200 and 400 include a plurality of page buffers and page buffer select means each corresponding to a bit line of the bank.

In more detail, $(1-1)^{th}$ to $(1-N)^{th}$ bit lines BL00 to BL0N of the first bank 100 are connected to $(1-1)^{th}$ to $(1-N)^{th}$ page buffers 210-1 to 210-N within the first page buffer unit 200, respectively. The $(1-1)^{th}$ to $(1-N)^{th}$ page buffers 210-1 to 210-N are connected to $(1-1)^{th}$ to $(1-N)^{th}$ page buffer select means 220-1 to 220-N, respectively. Meanwhile, $(2-1)^{th}$ to $(2-N)^{th}$ bit lines (BL10 to BL1N) of the second bank 500 are connected to $(2-1)^{th}$ to $(2-N)^{th}$ page buffers 410-1 to 410-N within the second page buffer unit 400, respectively. The $(2-1)^{th}$ to $(2-N)^{th}$ page buffers 410-1 to 410-N are connected to $(2-1)^{th}$ to $(2-N)^{th}$ page buffer select means 420-1 to 420-N, respectively. The $(1-1)^{th}$ to $(1-N)^{th}$ page buffer select means 220-1 to 220-N and the $(2-1)^{th}$ to $(2-N)^{th}$ page buffer select means 420-1 to 420-N are connected to correspond one another. Furthermore, the $(1-1)^{th}$ to $(1-N)^{th}$ page buffer select means 220-1 to 220-N and the $(2-1)^{th}$ to $(2-N)^{th}$ page buffer select means 420-1 to 420-N that, which are connected to correspond one another, are each connected to an input/output line by means of first to $N^{th}$ switches 310-1 to 310-N (wherein N is natural numbers 1, 2, 3 . . . ).

Since all the page buffers, the page buffer select means and the switching means have the same structure, respectively, the construction and operation of the $(1-1)^{th}$ and $(2-1)^{th}$ page buffer 210-1 and 420-1, the $(1-1)^{th}$ and $(2-1)^{th}$ page buffer select mean 220-1 and 420-1, and the first switching mean 310-1 will be described only, in the present embodiment.

The $(1-1)^{th}$ page buffer 210-1 and the $(1-1)^{th}$ page buffer select mean 220-1 are serially connected between a $(1-1)^{th}$ bit line BL00 of the first bank 100 and a first node Q1. The $(2-1)^{th}$ page buffer 410-1 and the $(2-1)^{th}$ page buffer select mean 420-1 are serially connected between the $(2-1)^{th}$ bit line BL10 of the second bank 500 and the first node Q1. The first switching mean 310-1 is connected between the input/output line and the first node Q1.

Specifically, the $(1-1)^{th}$ page buffer 210-1 includes first to fifth transistors T1 to T5, and a first latch L1 having first and second inverters I1 and I2.

The first transistor T1 is connected between the $(1-1)^{th}$ bit line BL00 of the first bank 100 (first input/output terminal of the $(1-1)^{th}$ page buffer) and a second node Q2 and is driven by an external first bank bit line select signal BSL0. The second transistor T2 is connected between the second node Q2 and a second input/output terminal of the $(1-1)^{th}$ page buffer 210-1 and is driven by an external first bank program enable signal PGM0. The third transistor T3 is connected between the power supply terminal and the second node Q2 and is driven by an external first bank precharge signal PRE0. Further, the fourth and fifth transistors T4 and T5 are serially connected between the ground and one input terminal of the first latch L1, and are driven by a first bank latch enable signal LATCH0 and an electric potential of the second node Q2, respectively. The other input terminal of the first latch L1 is connected to the second input/output terminal of the $(1-1)^{th}$ page buffer 210-1.

The first page buffer select mean 220-1 is connected between the second input/output terminal of the first $(1-1)^{th}$ page buffer 210-1 and the first node Q1 and includes a sixth transistor T6 driven by an external first control signal YA0.

The $(2-1)^{th}$ page buffer 410-1 includes seventh to eleventh transistors T7 to T11, and a second latch L2 having third and fourth inverters I3 and I4.

The seventh transistor T7 is connected between the $(2-1)^{th}$ bit line BL10 of the second bank 500 (first input/output terminal of the $(2-1)^{th}$ page buffer) and a third node Q3, and is driven by an external second bank bit line select signal BSL1. The eighth transistor T8 is connected between the third node Q3 and the second input/output terminal of the $(2-1)^{th}$ page buffer 410-1, and is driven by an external second bank program enable signal PGM1. The ninth transistor T9 is connected between the power supply terminal and the third node Q3, and is driven by an external second bank precharge signal PRE1. Further, the tenth and eleventh transistors T10 and T11 are serially connected between the ground and one input terminal of a second latch L2, and are driven by a second bank latch enable signal LATCH1 and an electric potential of the third node Q3, respectively. The other input terminal of the second latch L2 is connected to the second input/output terminal of the $(2-1)^{th}$ page buffer 410-1.

The $(2-1)^{th}$ page buffer select mean 420-1 is connected between a second input/output terminal of the $(2-1)^{th}$ page buffer 410-1 and the first node Q1, and includes a twelfth transistor T12 driven by an external second control signal YA1.

The first switching mean 310-1 is connected to the first node Q1 and an input/output (I/O) line 600, and includes a thirteenth transistor T13 driven by an external third signal YB.

Detailed explanation on the operation of a dual bank will now be given using the operation of the circuit and bank.

The operation of the elements constituting the circuit will be first described in short. The first transistor T1 uses the first bank bit line select signal BSL0 to select the bit line BL00. The second transistor T2 connects the first latch L1 and the bit line BL00 in the program operation. The third transistor T3 precharges the bit line in the read operation. The fourth and fifth transistors T4 and T5 sense the data of the first bank 100 in the read operation. The first latch L1 stores the data of the page buffer. The sixth transistor T6 uses the external first control signal YA0 (address decoder output) to select the page buffer within the first page buffer unit 200. The seventh transistor T7 uses the second bank bit line select signal BSL0 to select the bit line BL10. The eighth transistor T8 connects the second latch L2 and the bit line BL10 in the program operation. The ninth transistor T9 precharges the bit line in the read operation. The tenth and eleventh transistors T10 and T11 sense the data of the second bank 500 in the read operation. The second latch L2 stores the data of the page buffer. The twelfth transistor T12 uses the external second control signal YA1 (address decoder output) to select the page buffer within the second page buffer unit 400.

The operation of the circuit and bank through the bank operation can be explained in detail, as follows. If the read operation is performed for the first bank 100, the $(1-1)^{th}$ bit line BL00 is selected by the first bank bit line select signal BLS0 and the first transistor T1. The second node Q2 is precharged by the first bank precharge signal PRE0 and the third transistor T3. The data value of the $(1-1)^{th}$ bit line BL00 is stored in the first latch L1 by means of the first bank program enable signal PGM0 and the second transistor T2.

The sixth transistor T6 of the $(1-1)^{th}$ page buffer select mean 220-1 is driven by the external first control signal YA0, thus transmitting the data value of the first latch L1. At this time, the thirteenth transistor T13 of the first switching mean 310-1 is driven by the third control signal YB, thus transmitting the data value of the first latch L1 to the input/output line 600, or the twelfth transistor T12 of the $(2-1)^{th}$ page buffer select mean 420-1 is driven by the second control signal YA1, thus transmitting the data value of the first latch L1 to the second latch L2.

If the program operation is performed for the first bank 100, the data of the input/output line 600 is transmitted to the first latch L1 since the thirteenth transistor T13 and the sixth transistor T6 are driven by the third control signal YB and the first control signal YA0, respectively. Meanwhile, the data value of the bit line of the second bank 500 is transmitted to the first latch L1 via the twelfth transistor T12 and the sixth transistor T6 by means of the second control signal YA1 and the first control signal YA0. The data transmitted to the first latch L1 is latched and is then transmitted to the (1-1)$^{th}$ bit line BL00 of the first bank 100 by means of the first bank program enable signal PGM0, the bit line select signal BSL0, etc. The erase operation of the first bank 100 is not specially limited but same to that of the flash device. Detailed explanation on it will be thus omitted. Further, detailed explanation on the read, program and erase operation of the second bank 500 will be omitted since they are same to those of the first bank 100.

A bank operation of the flash memory according to an embodiment of the present invention will be described with reference to FIG. 4.

Figure 4A:
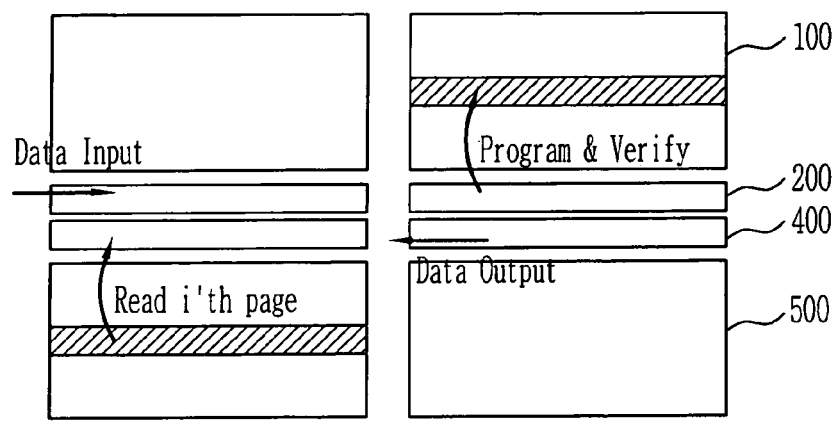
FIGS. 4A and 4B are conceptual views for explaining the operation of the bank in the NAND flash memory according to the present invention.
Figure 4B:
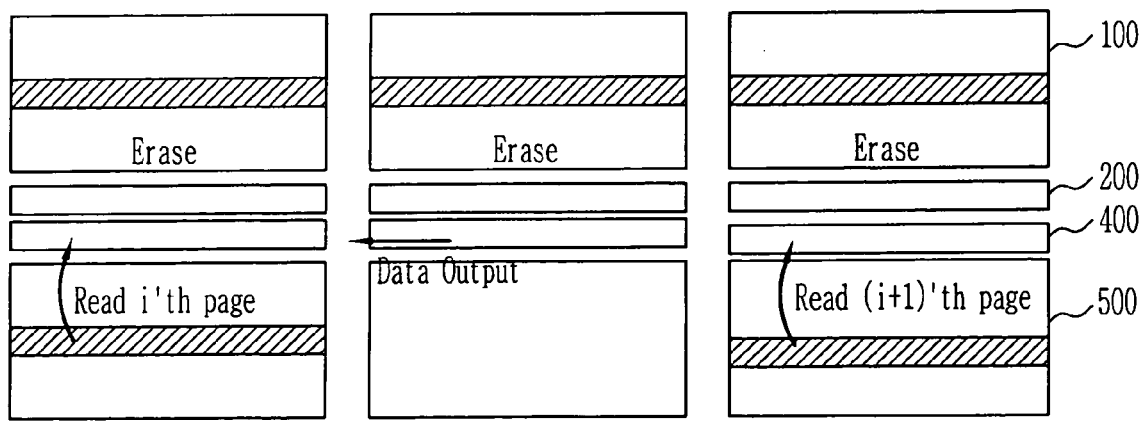

FIG. 4A and FIG. 4B are conceptual views for explaining the operation of the bank in a NAND flash memory according to the present invention.

Referring to FIG. 2, FIG. 3 and FIG. 4A, cases that the program operation is performed for the first bank and the read operation is performed for the second bank may be explained as follows. As in FIG. 4A, data that will be inputted to the first bank 100 from the external input/output line is transmitted to the first page buffer unit 200. Meanwhile, the second bank 500 transmits data that will be read by an external read signal to the second page buffer unit 400. At this time, the external control signals YB, YA0 and YA1 make the thirteenth and sixth transistors T13 and T6 turned on and the twelfth transistor T12 turned off.

The data buffered in the first page buffer unit 200 is programmed in the first bank 100. The data buffered in the second page buffer unit 400 is transmitted to the outside via the input/output line 600. At this time, the external control signal makes the sixth transistor T6 turned off and the twelfth and thirteenth transistors T12 and T13 turned on. During the program operation of the first bank 100, the second bank 500 performs a next read operation in the same manner to the above.

By reference to FIG. 2, FIG. 3 and FIG. 4B, cases where the erase operation is performed for the first bank 100 and the read operation is performed for the second bank 500 can be explained as follows. As shown in FIG. 4B, the first bank 100 performs the erase operation using the external erase signal. Meanwhile, the second bank 200 transmits data that will be read by the external read signal to the second page buffer unit 400. At this time, the sixth, twelfth and thirteenth transistors T6, T12 and T13 are turned off by the external control signal.

The data buffered in the second page buffer unit 400 is transmitted to the outside via the input/output line 600. At this time, the external control signal makes the sixth transistor T6 turned off and the twelfth and thirteenth transistors T12 and T13 turned on.

The second bank 500 performs the read operation as described above until the erase operation of the first bank 100 is completed.

Furthermore, the data of the first bank 100 can be immediately transmitted to the second bank 500. In other words, the data buffered in the first page buffer unit 200 can be transmitted to the second page buffer unit 400. At this time, the external control signal makes the sixth and twelfth transistors T6 and T12 turned on and the thirteenth transistor T13 turned off.

As such, the bank structure of the present invention is a dual bank shape. Thus, the first bank 100 can perform the read, program or erase operation while the second bank 500 performs the read, program or erase operations. At this time, the read, program and erase operations are performed every page. Those skilled in the art will appreciate that the mentioned operations can be easily implemented in various shapes using the circuit diagram of the present embodiment and the above operation.

It should be noted that the present invention is not limited to the above operation and a cache program operation can be performed using one of the first and second page buffer units 200 and 400 as a cache buffer. For example, in order to program the first bank 100 using the second page buffer unit 400 as the cache buffer, a data is inputted to the second page buffer unit 400 and is then transmitted to the first page buffer 200. While the first bank 100 is programmed, a data for a next page is transferred to the second page buffer unit 400 being the cache buffer.

Meanwhile, in order to read the first bank 100 using the second page buffer unit 400 as the cache buffer, the data of the first bank 100 is transmitted to the first page buffer unit 200. The data of the first page buffer unit 200 is again transferred to the second page buffer unit 400 used as the cache buffer. The data of the second page buffer unit 400 is then outputted through the input/output line. At this time, a next page of the first bank 100 is transmitted to the first page buffer unit 200.

According to the present invention described above, a block of a flash memory is divided into two banks. Each page buffer is located between the two banks to share an input/output line. Thus, it is possible to shorten the length of a bit line.

Furthermore, the present invention has advantages that it can improve a data-sensing rate, and allows one bank to perform a read, write or erase operation while the other bank performs other operations.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. An apparatus for dividing a bank in a flash memory, the flash memory having a first bank and a second bank that share an input/output line, comprising;
   a first page buffer connected to a bit line of the first bank, and buffering a data that will be transmitted to/from the first bank;
   a second page buffer connected to a bit line of the second bank, and buffering a data that will be transmitted to/from the second bank;
   a first page buffer select mean connected between the first page buffer and a first node, and controlling a transmission of the data that will be transmitted to/from the first page buffer;
   a second page buffer select mean connected between the second page buffer and the first node, and controlling transmission of the data that will be transmitted to/from the second page buffer; and
   a switching mean connected between the first node and the input/output line, and controlling transmission of the data between the first and second page buffer select mean and the input/output line.

2. The apparatus as claimed in claim 1, wherein the first page buffer select mean comprises a first transistor connected between the first page buffer and the first node, and driven by an external first control signal.

3. The apparatus as claimed in claim 1, wherein the second page buffer select mean comprises a second transistor connected between the second page buffer and a second node, and driven by an external second control signal.

4. The apparatus as claimed in claim 1, wherein the switching mean comprises a third transistor connected between the first node and the input/output line, and driven by an external third control signal.

* * * * *